United States Patent
Kang et al.

(10) Patent No.: US 6,480,410 B2
(45) Date of Patent: Nov. 12, 2002

(54) NONVOLATILE FERROELECTRIC MEMORY DEVICE AND METHOD FOR DRIVING THE SAME

(75) Inventors: Hee Bok Kang, Daejeon-shi (KR); Hun Woo Kye, Kyonggi-do (KR); Duck Ju Kim, Cheju-do (KR); Je Hoon Park, Kyonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/983,505

(22) Filed: Oct. 24, 2001

(65) Prior Publication Data

US 2002/0048184 A1 Apr. 25, 2002

(30) Foreign Application Priority Data

Oct. 24, 2000 (KR) ........................................ 2000-62630

(51) Int. Cl.[7] ............................................... G11C 11/22
(52) U.S. Cl. ........................................ 365/145; 365/210
(58) Field of Search ................................. 365/145, 203, 365/210, 189.01, 226

(56) References Cited

U.S. PATENT DOCUMENTS

| | | | |
|---|---|---|---|
| 4,873,664 A | 10/1989 | Eaton, Jr. | |
| 5,424,975 A | 6/1995 | Lowrey et al. | |
| 5,432,731 A | 7/1995 | Kirsch et al. | |
| 5,541,872 A | 7/1996 | Lowrey et al. | |
| 5,638,318 A | 6/1997 | Seyyedy | |
| 5,680,344 A | 10/1997 | Seyyedy | |
| 5,682,344 A | 10/1997 | Seyyedy | |
| 6,285,576 B1 | * 9/2001 | Kang | |

* cited by examiner

*Primary Examiner*—Son T. Dinh
(74) *Attorney, Agent, or Firm*—Birch, Stewart, Kolasch & Birch, LLP

(57) ABSTRACT

A nonvolatile ferroelectric memory device and method for driving the same includes data reading and writing operations performed uniformly in a whole cell array and reduces the size of a cell by lowering a sensing voltage. The nonvolatile ferroelectric memory device includes a main cell and a reference cell provided with one transistor and one or more ferroelectric capacitors among a first voltage applying line (wordline), a bitline and a second voltage applying line. The method includes the steps of primarily activating the wordline and a reference wordline at high level in an active period of one cycle, inactivating the wordline and the reference wordline, activating a sensing amplifier after the wordline is inactivated, secondarily or thirdly activating the wordline at high level in a state that the sensing amplifier is activated in the active period, applying a high level at least once or more to the second voltage applying line to be coincident with the secondary or third active period of the wordline in at least one point, and transiting a chip enable signal from low level to high level to precharge the chip enable signal.

40 Claims, 16 Drawing Sheets

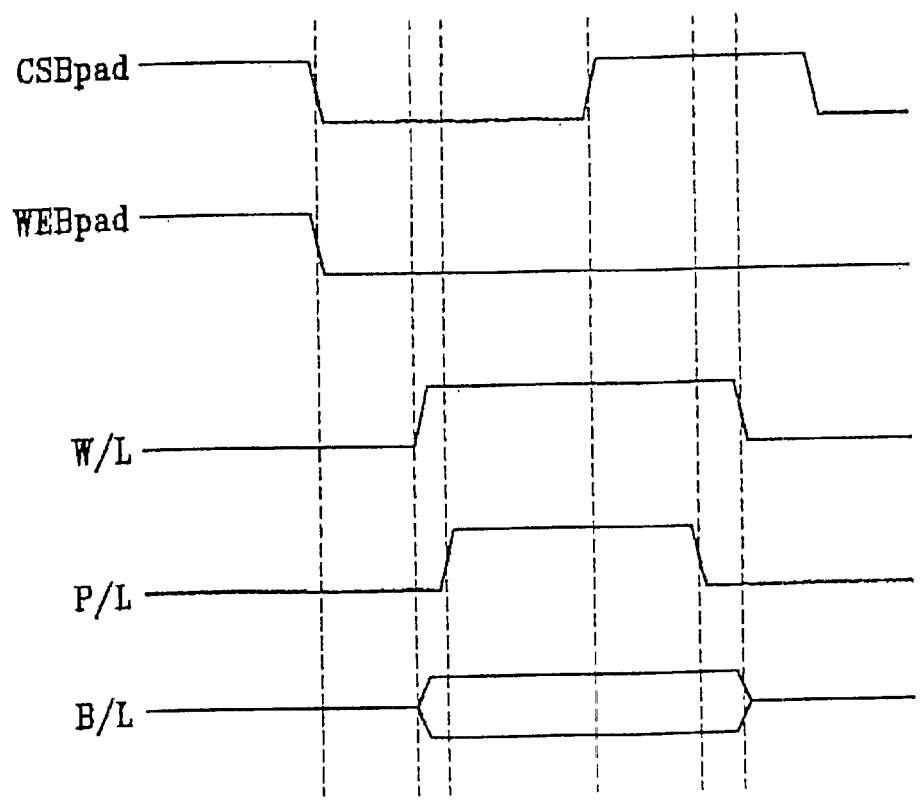

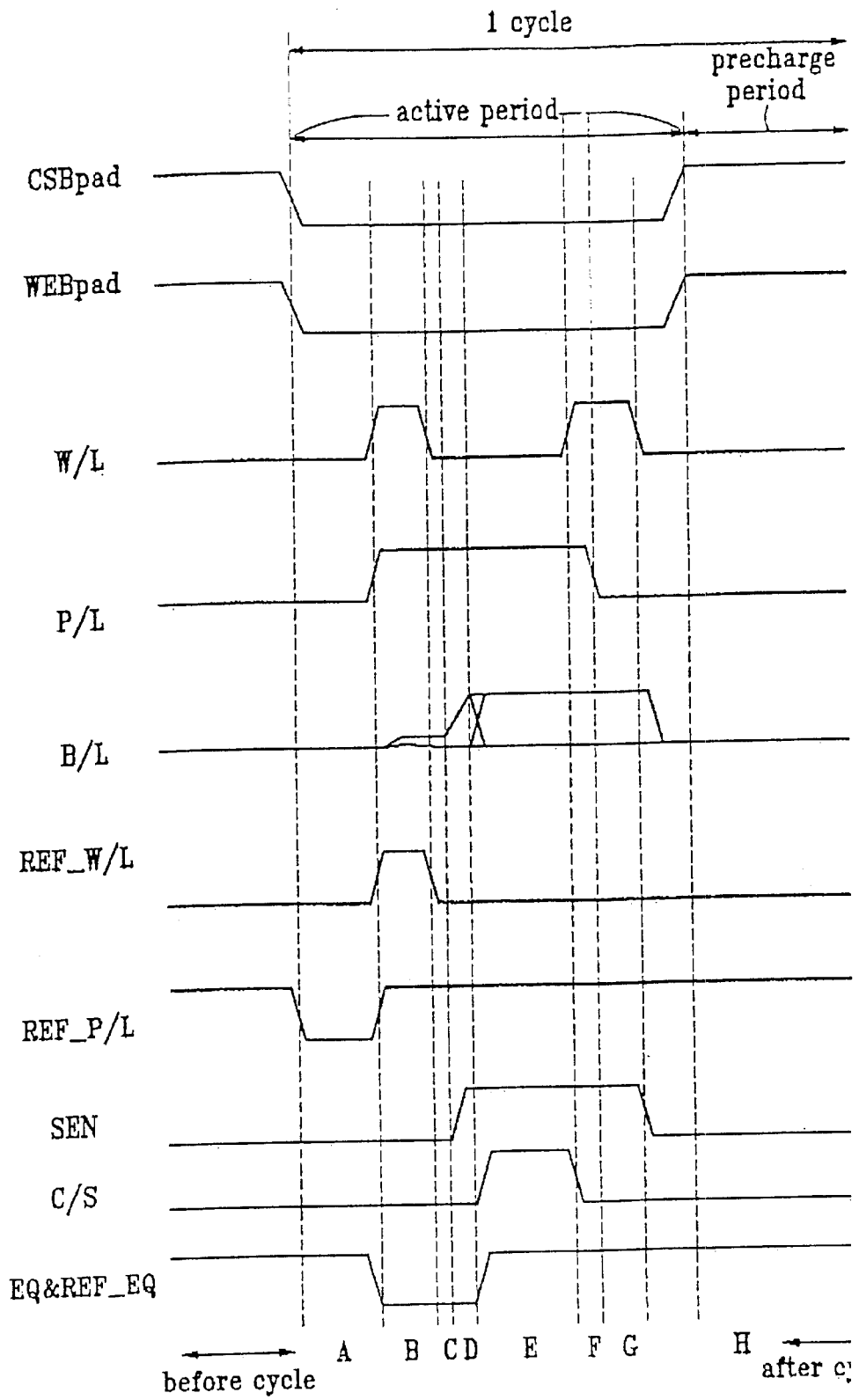

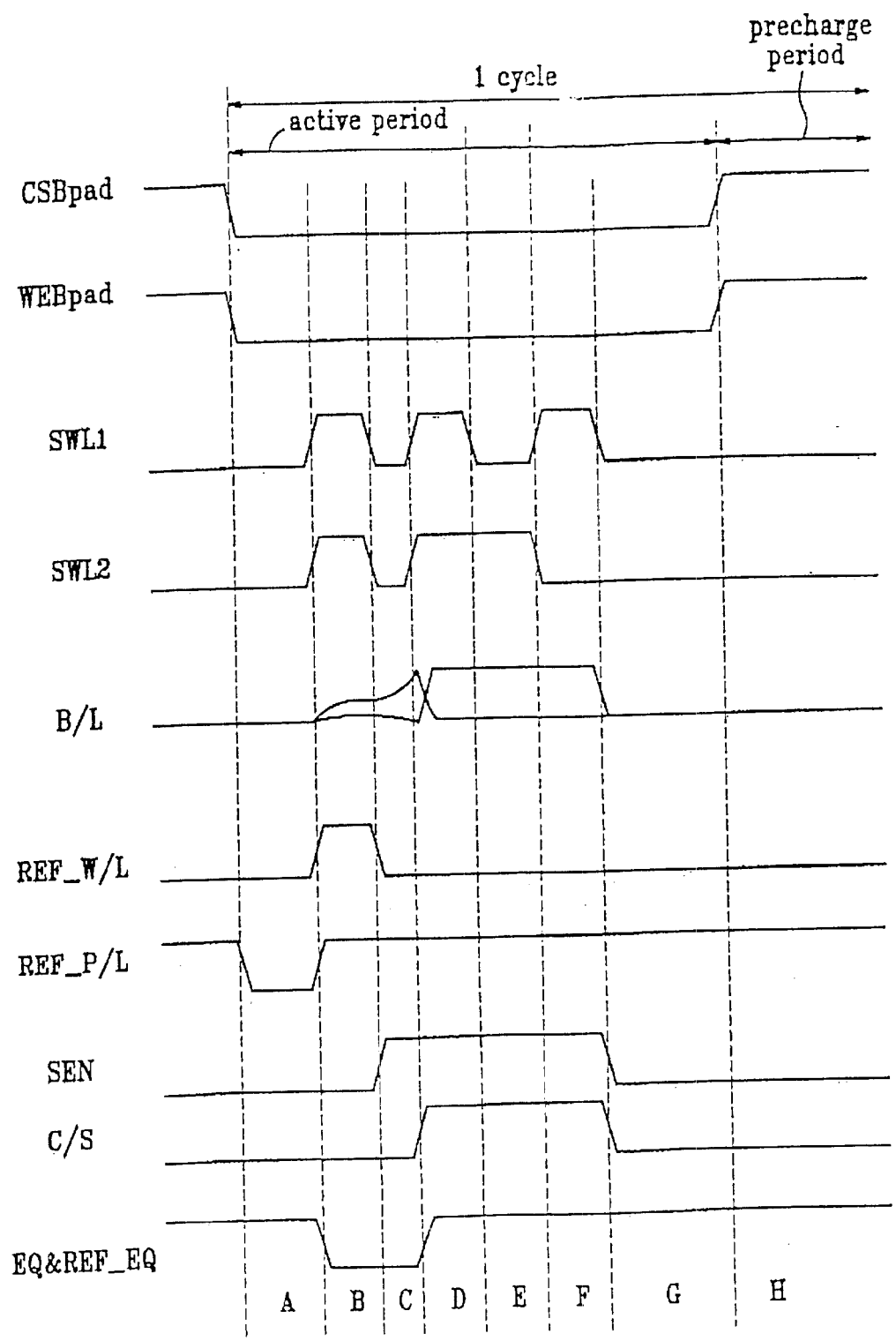

NONVOLATILE FERROELECTRIC MEMORY DEVICE AND METHOD FOR DRIVING THE SAME

BACKGROUND OF THE INVENTION

1. Field of the Invention

The present invention relates to a semiconductor memory device, and more particularly, to a nonvolatile ferroelectric memory device and method for driving the same.

2. Background of the Related Art

Generally, a nonvolatile ferroelectric memory, i.e., a ferroelectric random access memory (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 shows an hysteresis loop of a related art ferroelectric memory device. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory device will now be described. FIG. 2 shows unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline W/L in the same direction as the wordline W/L, a transistor T with a gate connected with the wordline and a source connected with the bitline B/L, and a ferroelectric capacitor FC1. A first terminal of the ferroelectric capacitor FC1 is connected with a drain of the transistor T and a second terminal is connected with the plate line P/L.

The data input/output operation of the related art nonvolatile ferroelectric memory device will now be described. FIG. 3a is a timing chart illustrating the operation of the write mode of the related art nonvolatile ferroelectric memory device, and FIG. 3b is a timing chart illustrating the operation of read mode thereof.

During the write mode, an externally applied chip enable signal CSBpad is activated from high state to low state. At the same time, if a write enable signal WEBpad is applied from high state to low state, the write mode starts. Subsequently, if address decoding in the write mode starts, a pulse applied to a corresponding wordline is transited from low state to high state to select a cell.

In a period where the wordline is maintained at high state, a high signal in a certain period and a low signal in a certain period are sequentially applied to a corresponding plate line. To write a logic value "1" or "0" in the selected cell, a high signal or low signal synchronized with the write enable signal WEBpad is applied to a corresponding bitline.

In other words, a high signal is applied to the bitline, and if the low signal is applied to the plate line in a period where the signal applied to the wordline is high, a logic value "1" is written in the ferroelectric capacitor. If a low signal is applied to the bitline, and if the signal is applied to the plate line is high, a logic value "0" is written in the ferroelectric capacitor FC1.

With reference to FIG. 3b, the reading operation of data stored in a cell by the above operation of the write mode will now be described. If an externally applied chip enable signal CSBpad is activated from a high state to a low state, all the bitlines become equipotential to low voltage by an equalizer signal EQ before a corresponding wordline is selected.

Then, the respective bitline becomes inactive and an address is decoded. The low signal is transited to the high signal in the corresponding wordline according to the decoded address so that a corresponding cell is selected.

The high signal is applied to the plate line of the selected cell to destroy data corresponding to the logic value "1" stored in the ferroelectric memory. If the logic value "0" is stored in the ferroelectric memory, the corresponding data is not destroyed.

The destroyed data and the data that is not destroyed are output as different values by the ferroelectric hysteresis loop, so that a sensing amplifier senses the logic value "1" or "0". In other words, if the data is destroyed, the "d" state is transited to an "f" state as shown in the hysteresis loop of FIG. 1. If the data is not destroyed, "a" state is transited to the "f" state. Thus, if the sensing amplifier is enabled after a set time has elapsed, the logic value "1" is output in the case that the data is destroyed while the logic value "0" is output in the case that the data is not destroyed.

As described above, after the sensing amplifier outputs data, to recover the data to the original data, the plate line P/L becomes inactive from high state to low state at the state that the high signal is applied to the corresponding wordline.

The related art method for driving a nonvolatile ferroelectric memory device, as described above, has various disadvantages. When the data reading and writing operations are performed, it is necessary to activate the wordline from an active period of one cycle to a precharge period. In this case, it is difficult to restrict the quantity of charges generated from the cell. For this reason, it is difficult to uniformly write or read data in the whole cell array. In addition, since the sensing amplifier is activated when the wordline is activated at a high level, the capacitance difference between the main cell bitline and the reference cell bitline occurs. For this reason, the related art nonvolatile ferroelectric memory device has limitations in reducing the size of the cell by reducing the sensing voltage.

SUMMARY OF THE INVENTION

An object of the invention is to solve at least the above problems and/or disadvantages and to provide at least the advantages described hereinafter.

Another object of the present invention is to provide a nonvolatile ferroelectric memory device and method for driving the same that substantially obviates one or more of the problems caused by limitations and disadvantages of the related art.

Another object of the present invention is to provide a nonvolatile ferroelectric memory device and method for driving the same in which data reading and writing operations are performed uniformly in a whole cell array.

Another object of the present invention is to provide a nonvolatile ferroelectric memory device and method for driving the same in which the size of a cell is reduced by lowering a sensing voltage.

Another object of the present invention is to provide a nonvolatile ferroelectric memory and method for driving the same in which writing and restoring operations are stably performed in even case of low voltage.

Another embodiment of the invention includes a nonvolatile ferroelectric memory device according to the present invention including a first sub cell array and a second sub cell array each including a plurality of main cells, each main cell of the plurality of main cells having a split wordline pair including a first split wordline and a second split wordline, a main bitline pair including a first bitline and a second bitline, the first bitline and second bitline formed across the split wordline and the second split wordline, a reference cell coupled to the first bitline and second bitline, and a first column selector between the first bitline and a data bus and a second column selector between the second bitline and the databus, the first and second column selectors for selectively selecting the first or second bitlines; and a first sensing amplifier and a second sensing amplifier connected between the first sub cell array and the second sub cell array.

To further achieve the above objects in whole or in part according to the present invention, there is provided a method for driving a nonvolatile ferroelectric memory device that includes a main cell and a reference cell provided with one transistor and one or more ferroelectric capacitors among a first voltage applying line (wordline); a bitline and a second voltage applying line. The method includes primarily activating the wordline and a reference wordline at high level in an active period of one cycle; inactivating the wordline and the reference wordline; activating a sensing amplifier after the wordline is inactivated; secondarily or thirdly activating the wordline at high level in a state that the sensing amplifier is activated in the active period; applying high level of at least one time or more to the second voltage applying line to be coincident with the secondary or third active period of the wordline at least one point; and, changing a chip enable signal from low level to high level to precharge the chip enable signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following in which like reference numerals refer to like elements wherein:

FIG. 3a is a timing chart depicting the operation of a write mode of the related art nonvolatile ferroelectric memory device;

FIG. 9a depicts a timing chart of the operation of a write mode according to the first embodiment of the present invention, which is applied to the nonvolatile ferroelectric memory device of FIG. 4;

FIG. 10b depicts a schematic view of a main cell of FIG. 10a;

FIG. 11a depicts a timing chart of the operation of a write mode according to the second embodiment of the present invention, which is applied to the nonvolatile ferroelectric memory device of FIG. 10a;

FIG. 11b depicts a timing chart showing the operation of a read mode according to the second embodiment of the present invention, which is applied to the nonvolatile ferroelectric memory device of FIG. 10a;

FIG. 12a depicts a timing chart of the operation of a write mode according to a third embodiment of the present invention, which is applied to the nonvolatile ferroelectric memory device of FIG. 10a;

FIG. 12b depicts a timing chart of the operation of a read mode according to a third embodiment of the present invention, which is applied to the nonvolatile ferroelectric memory device of FIG. 10a.

DETAILED DESCRIPTION OF PREFERRED EMBODIMENTS

Figure 4:
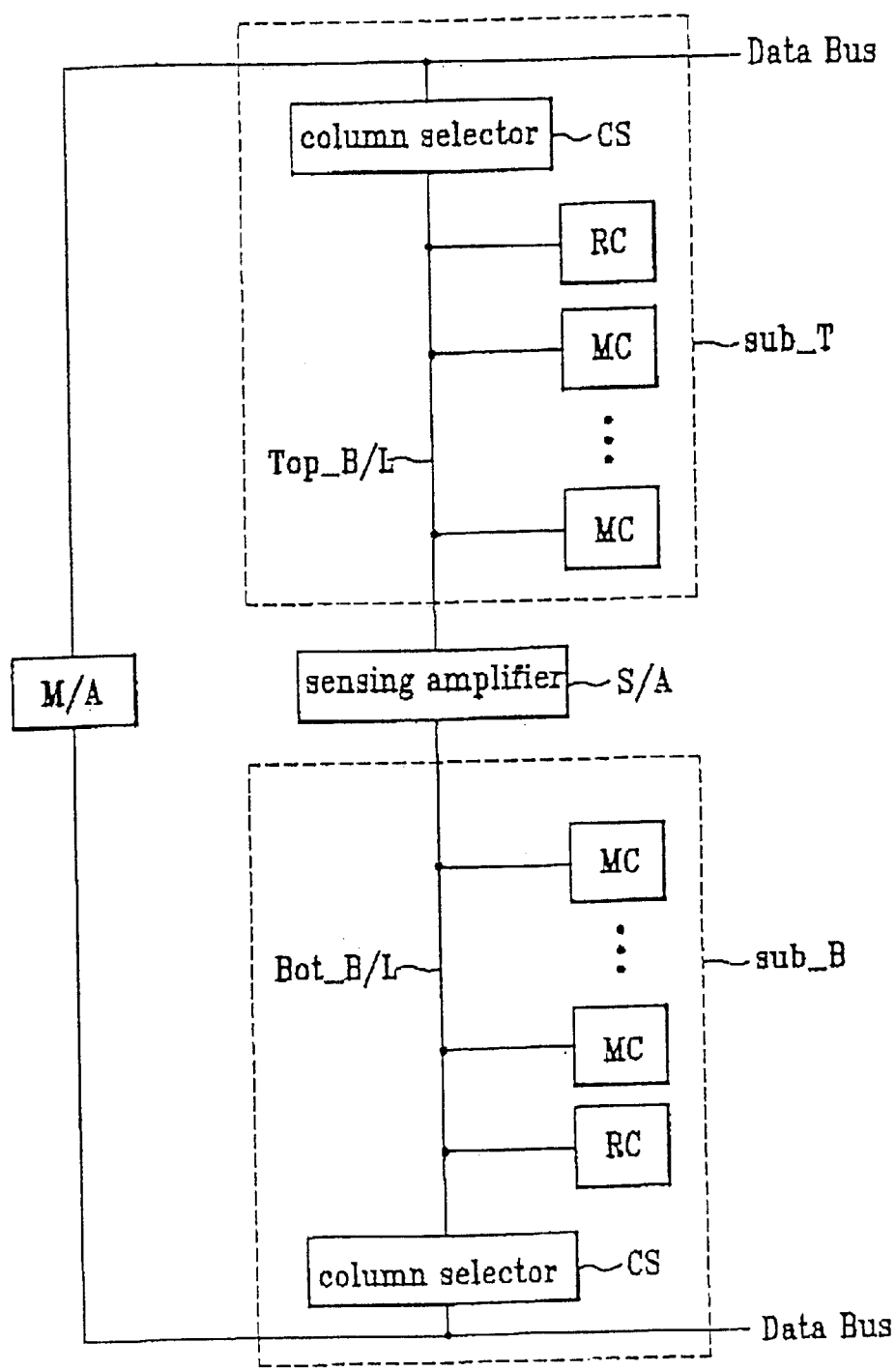
FIG. 4 depicts a schematic view of a cell array block of a nonvolatile ferroelectric memory device according to a first embodiment of the present invention.
Figure 5:
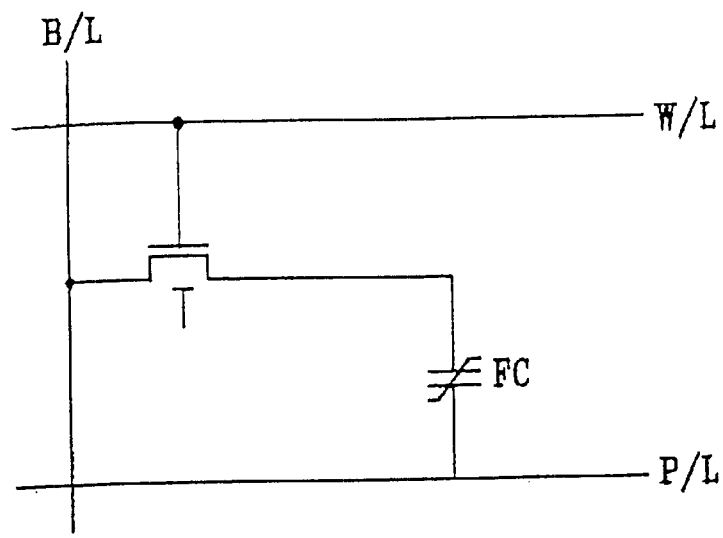
FIG. 5 depicts a schematic view of a main cell of FIG. 4.

FIG. 4 is a schematic view of a cell array block of a nonvolatile ferroelectric memory device according to a first embodiment of the present invention, and FIG. 5 is a schematic view of a main cell of FIG. 4.

A cell array block includes a plurality of sub cell arrays sub_T and sub_B.

A sensing amplifier S/A is formed between adjacent top and bottom sub cell arrays sub_T and sub_B, respectively.

The sub cell arrays sub_T and sub_B include bitlines Top_B/L and Bot_B/L, respectively; plurality of main cells MC connected to the bitlines Top_B/L and Bot_B/L; and a reference cell RC and a column selector CS connected to the bitlines Top_B/L and Bot_B/L.

The reference cell RC within the sub cell array sub_T is formed in a top portion of the sensing amplifier S/A and simultaneously accessed when the main cell MC within the sub cell array sub_B is accessed.

On the other hand, the reference cell RC within the sub cell array sub_B is formed in a bottom portion of the sensing amplifier S/A and simultaneously accessed when the main cell MC within the sub cell array sub_T is accessed.

The column selector CS selectively activates a corresponding column bitline using Y (column) address. If the column selector CS is in high level, the corresponding column bitline is connected to a data bus, so as to enable data transmission.

Figure 2:
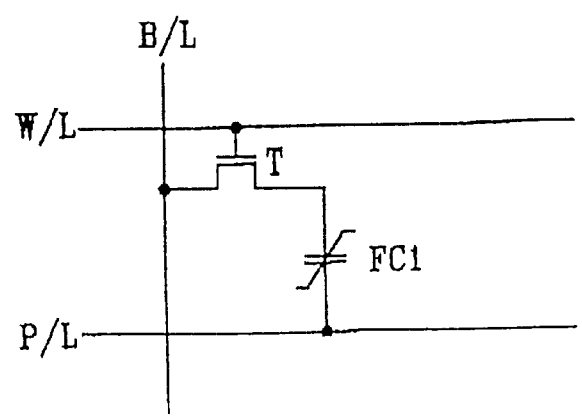
FIG. 2 depicts a schematic view of a unit cell of a related art nonvolatile ferroelectric memory.
Figure 3B:
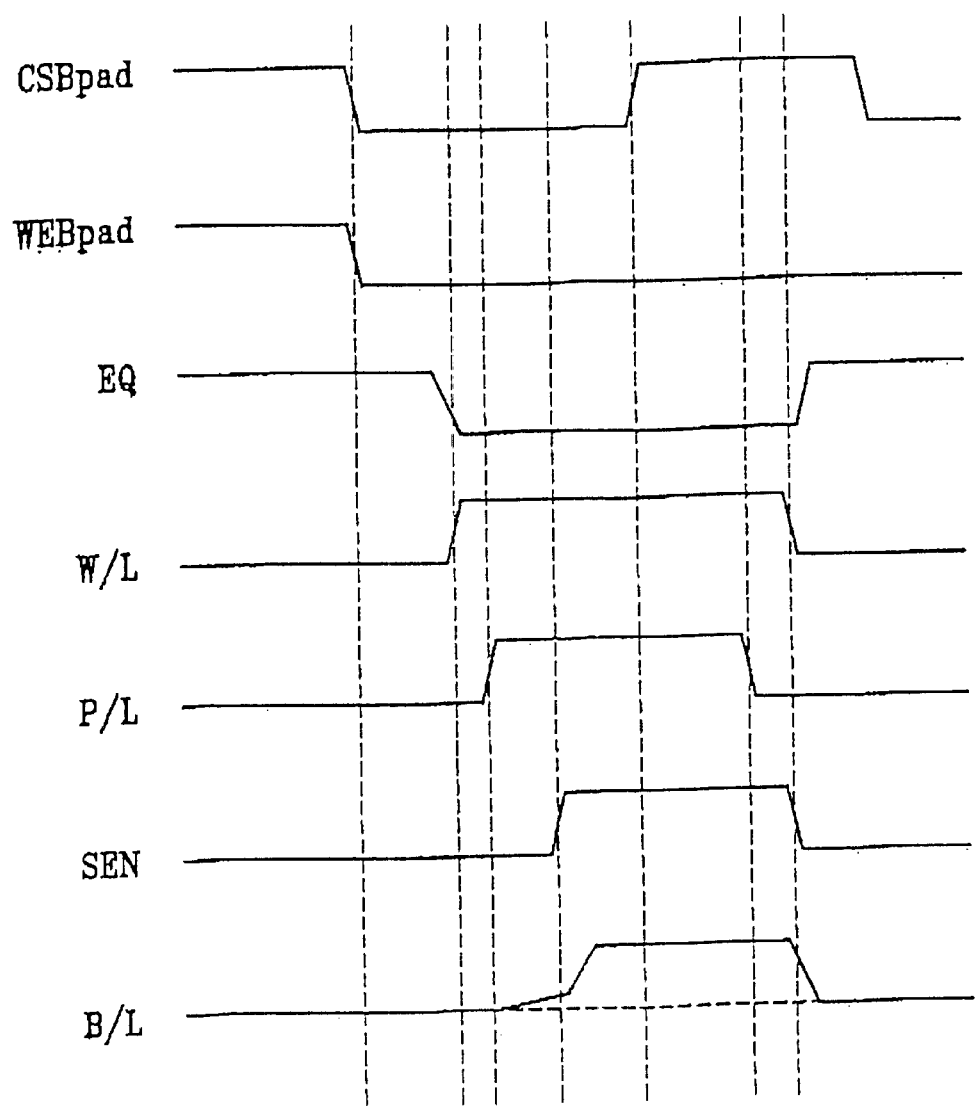
FIG. 3b is a timing chart depicting the operation of a read mode of the related art nonvolatile ferroelectric memory device.

The main cell MC is constructed as shown in FIG. 5, in the same manner as the main cell shown in FIG. 2. As shown, a bitline B/L is formed in one direction, and a wordline W/L is formed to cross the bitline B/L. A plate line P/L is spaced apart from the wordline W/L in the same direction as the wordline W/L. A transistor T with a gate connected with the wordline W/L and a source connected with the bitline B/L is formed. A ferroelectric capacitor FC is formed in such a manner that its first terminal is connected with a drain of the transistor T and its second terminal is connected with the plate line P/L.

Figure 6:
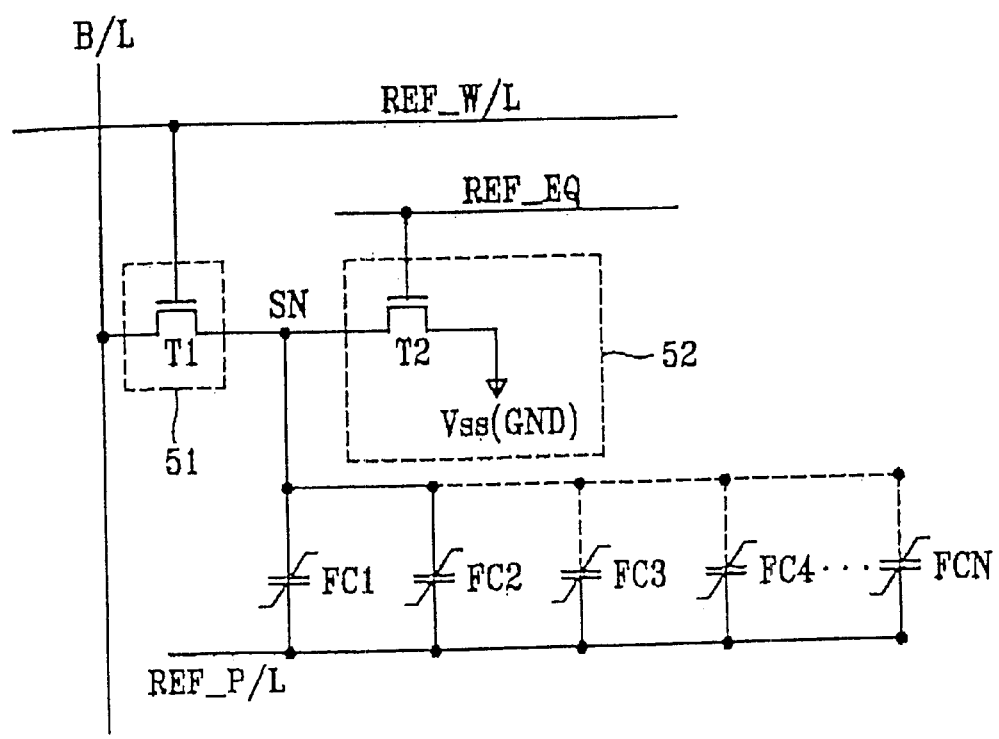
FIG. 6 depicts a schematic view of a reference cell of a nonvolatile ferroelectric memory device according to an embodiment of the present invention.

FIG. 6 is a detailed schematic view of a reference cell RC of a nonvolatile ferroelectric memory device according to the present invention. As shown in FIG. 6, the reference cell RC of the nonvolatile ferroelectric memory device includes a bitline B/L formed in one direction, a reference wordline REF_W/L formed across the bitline B/L, a switching block 51, a level initiating block 52, and a plurality of ferroelectric capacitors FC1, FC2, FC3, FC4, . . . , FCN. The switching block 51 is controlled by a signal of the reference wordline REF_W/L to selectively transmit a reference voltage stored in the ferroelectric capacitors to the bitline B/L. The level initiating block 52 selectively initiates a level of an input terminal of the switching block 51 connected to the ferroelectric capacitors. The ferroelectric capacitors FC1–FCN are connected to the input terminal of the switching block 51 in parallel.

The switching block 51 includes an NMOS transistor (hereinafter, "first transistor") T1 with a gate connected to the reference wordline REF_W/L, a drain connected to the bitline B/L, and a source connected to a storage node SN.

The level initiating block 52 is controlled by a reference cell equalizer control signal REF_EQ which is a control signal for initiating the storage node SN of the reference cell RC. Also, the level initiating block 52 includes an NMOS transistor (hereinafter, "second transistor") T2 connected between the source of the first transistor T1 and a ground terminal Vss.

The ferroelectric capacitors FC1, FC2, FC3, FC4, . . . , FCN include a first electrode, a second electrode, and a ferroelectric material formed between first and second electrodes. The first electrode of each ferroelectric capacitor is connected to the source of the first transistor T1, and its second electrode is connected to the reference plate line REF_P/L.

The number of the ferroelectric capacitors FC1, FC2, FC3, FC4, . . . ,FCN is determined depending on the desired capacitor size of the reference cell RC. That is, the number of the ferroelectric capacitors can freely be adjusted depending on the capacitor size of the reference cell.

The storage node SN is connected with first terminals of the ferroelectric capacitors FC1, FC2, FC3, FC4, . . . ,FCN in parallel.

The reference cell equalizer control signal REF_EQ initiates the storage node SN to a ground voltage level. Namely, if the reference cell equalizer control signal REF_EQ is in high level, the second transistor T2 is turned on so that the storage node SN is maintained at a ground voltage level.

Figure 1:
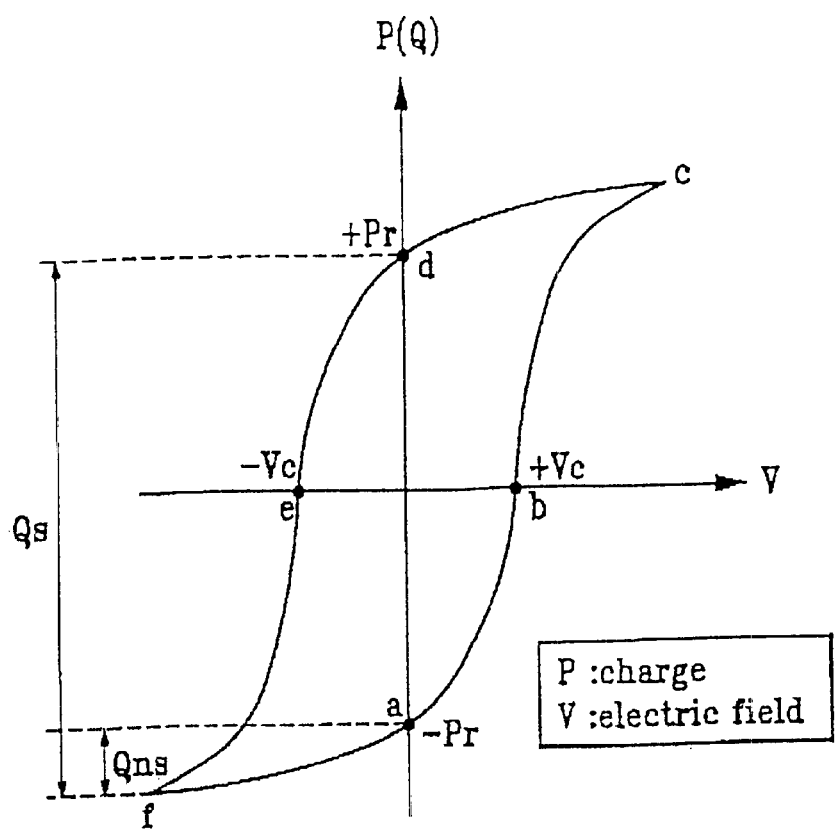
FIG. 1 depicts an hysteresis loop of a related art ferroelectric memory device.

The operation of the aforementioned reference cell will now be described. Qs and Qns of the hysteresis loop in FIG. 1 denote switching charges of the ferroelectric capacitor and non-switching charges of the ferroelectric capacitor, respectively. The reference cell of the present invention is based on Qns. That is to say, the reference wordline REF_W/L within the operation cycle is transited to high level together with the reference plate line REF_P/L. Accordingly, charges equivalent to the size of Qns x ferroelectric capacitor are supplied to the bitline B/L.

Then the reference wordline REF_W/L is changed to low level before the sensing amplifier S/A is operated, so that the reference cell RC is not affected by a voltage of the bitline B/L.

Meanwhile, the reference plate line REF_P/L is maintained at high level, and is transited to low level when the reference wordline REF_W/L is sufficiently stabilized.

As described above, since non-switching charges Qns are used, a separate restoring operation is not required during a precharge period. Accordingly, high level is not required any longer in the reference wordline REF_W/L.

Since the reference level is affected by an initial level of the storage node SN, the second transistor T2 of FIG. 6 is used to stabilize the storage node SN, and the reference equalizer control signal REF_EQ is used to initiate the storage node SN to the ground voltage level. Therefore, since the initial level of the storage node SN is maintained at the ground voltage level, the reference level can be stabilized.

The column selector will now be described with reference to FIG. 7.

Figure 7:
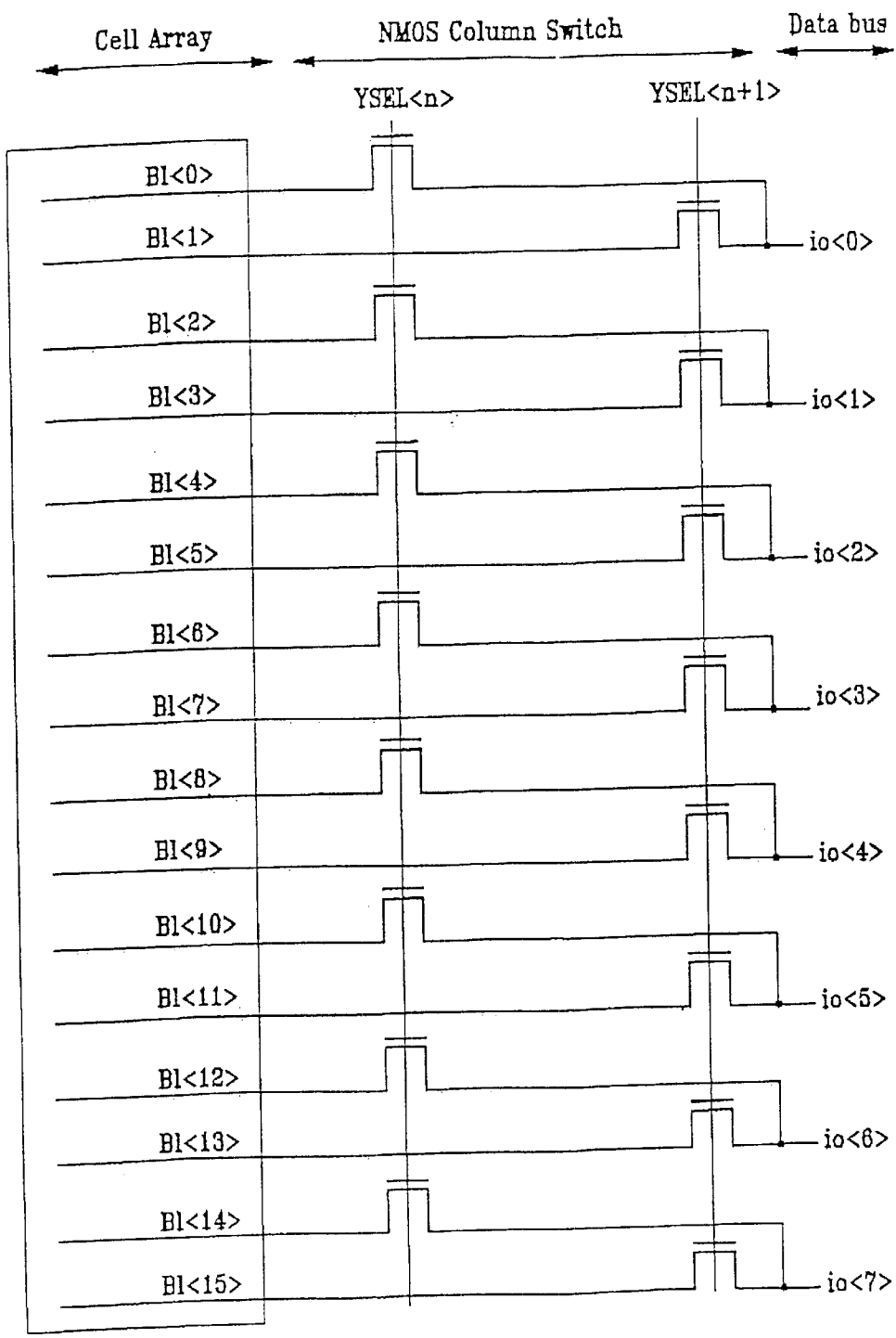
FIG. 7 depicts a circuit diagram of a column selector of a nonvolatile ferroelectric memory device according to an embodiment of the present invention.

As shown in FIG. 7, to transmit data of a data bus io<m> (where, m is a random number and denotes an integer within the range of 0≦m≦7) to a bitline B1<x> or B1<x+1> (where, x is a random number and denotes an integer within the range of 0≦x≦14), the column selector includes two NMOS transistors which perform switching operation by receiving first and second output signals YSEL<n> and YSEL<n+1> of a column decoder.

The whole column selector is formed by repeating the above configuration.

At this time, the NMOS transistor controlled by the first output signal YSEL<n> is arranged in the first(or odd numbered) bitline unit while the NMOS transistor controlled by the second output signal YSEL<n+1> is arranged in the second(or even numbered) bitline unit. Thus, the NMOS transistors are alternately arranged one by one per each bitline, as shown in FIG. 7.

Figure 8:
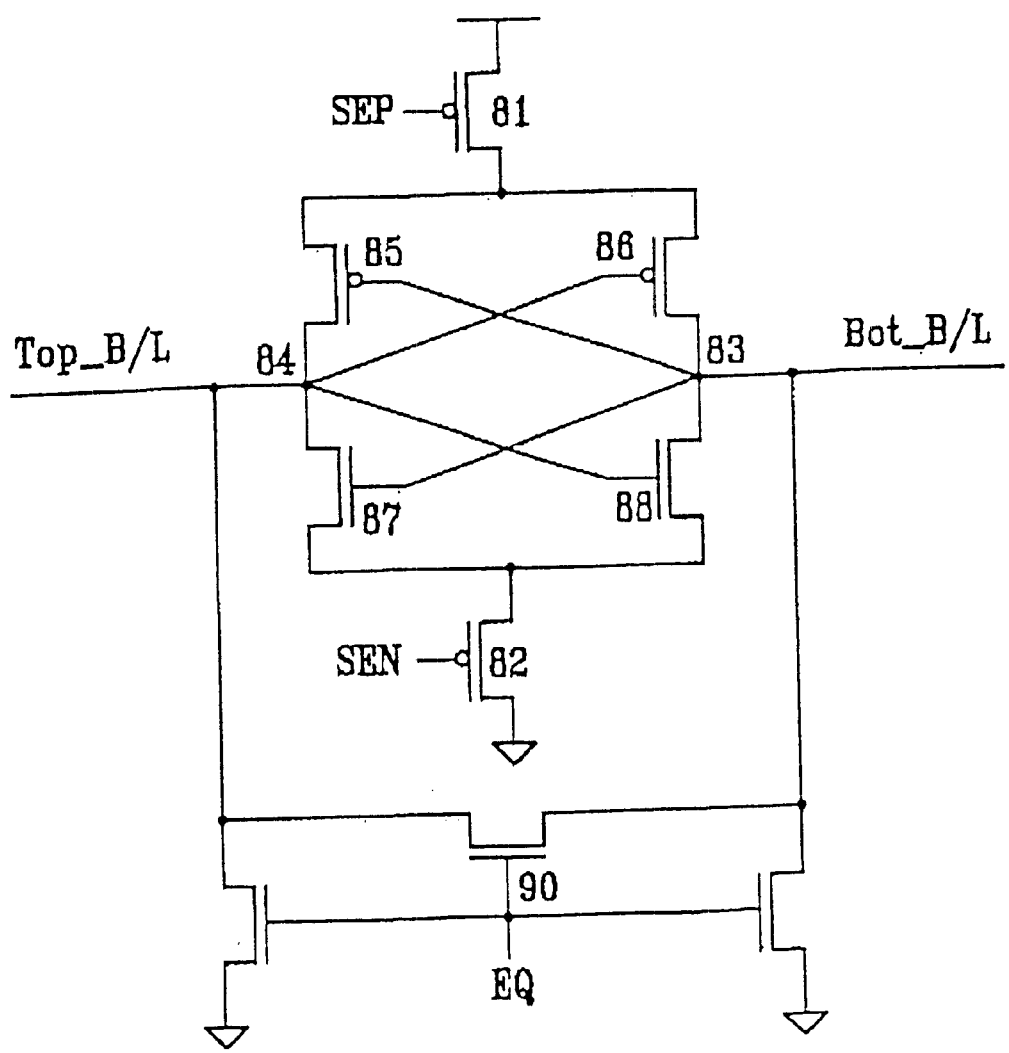
FIG. 8 depicts a schematic view of a sensing amplifier of a nonvolatile ferroelectric memory device according to an embodiment of the present invention.

As shown in FIG. 8, the sensing amplifier S/A includes first and second NMOS transistors 81, 82 which are operated by receiving SEP signal and SEN signal, and two latch type CMOS transistors 83, 84 (wherein a respective PMOS transistor 85, 86 and NMOS transistor 87, 88 are serially connected with each other) connected in parallel between the first and second NMOS transistors 81 and 82.

The bitlines Top_B/L and Bot_B/L are connected to output terminals of the respective CMOS transistors 83, 84. An NMOS transistor 90 is respectively formed between the bitlines Top_B/L and Bot_B/L and between the bitlines Top_B/L and Bot_B/L and the ground voltage. The NMOS transistor 90 acts to equalize levels of the bitlines Top_B/L and Bot_B/L by receiving the EQ signal.

As described above, the sensing amplifier S/A is a latch type, and the bitlines Top_B/L and Bot_B/L are equalized at low level by the EQ signal.

The SEN signal is a sensing amplifier enable signal, and the SEP signal is a signal having a phase opposite to the SEN. When the data of the main cell MC and the reference cell RC are sufficiently transmitted to the bitlines, the SEN is activated at high level and at the same time the SEP is activated at low level, so that the sensing operation starts.

The method for driving the aforementioned nonvolatile ferroelectric memory device according to the first embodiment of the present invention will now be described.

Figure 9B:
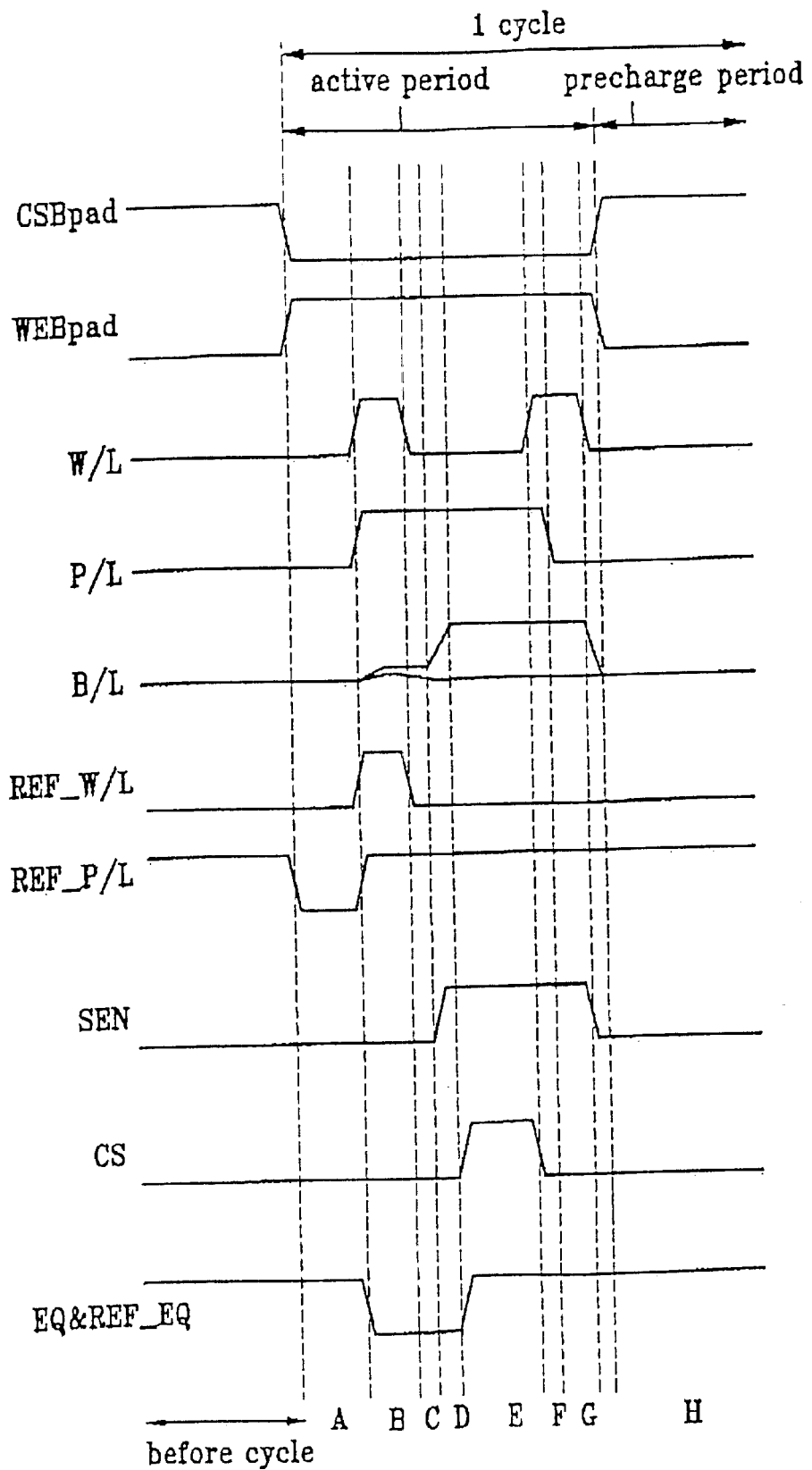
FIG. 9b depicts a timing chart of the operation of a read mode according to the first embodiment of the present invention, which is applied to the nonvolatile ferroelectric memory device of FIG. 4.

FIG. 9a is a timing chart showing the operation of a write mode according to the first embodiment of the present invention, which is applied to the nonvolatile ferroelectric memory device of FIG. 4, and FIG. 9b is a timing chart showing the operation of a read mode according to the first embodiment of the present invention, which is applied to the nonvolatile ferroelectric memory device of FIG. 4.

One cycle for writing and reading operations includes an active period and a precharge period. That is, one cycle is completed in such a manner that the chip enable signal CSBpad is changed to low level to start the active period, and then the precharge period advances.

During the active period in one cycle, the wordline is activated to high level twice or more. After the wordline is transited from high level to low level (i.e., after the wordline is inactivated), the sensing amplifier S/A is activated, so that reading and writing operations of the memory cell can be performed.

When the high level is given to the wordline twice, the first high level is used to read the data of the cell and the second high level or later is used to restore data of the cell or write new data.

It is noted that operation waveforms of the write mode and the read mode are similar in FIGS. 9a and 9b. However, in FIG. 9a, external data is forcibly input to the bitline through a data input pad (Din pad) when the writing operation is performed by the write enable signal WEBpad. In FIG. 9b, data of the sensing amplifier S/A is transmitted to external data input/output pad (Din/out pad).

With reference to the waveforms of FIGS. 9a and 9b, the data writing and reading operations according to the first embodiment of the present invention will be described.

In the first embodiment of the present invention, the plate line has a single high level when the wordline is activated to a high level.

As shown in FIGS. 9a and 9b, the external chip enable signal CSBpad is transited from high level to low level during A period, so that the active period of the chip starts. During the active period, the write enable signal WEBpad is in a low level.

During period A, the reference wordline REF_W/L is maintained at low level, and the reference plate line REF_P/L is changed from a high level to a low level.

Subsequently, if address decoding starts, a corresponding wordline W/L, a corresponding plate line P/L, a corresponding reference wordline REF_W/L, and a corresponding reference plate line REF_P/L are activated to high levels during B period. Thus, the data of the main cell MC and the data of the reference cell RC are respectively transmitted to their bitline.

For reference, the bitline to which the data of the main cell MC is transmitted is not the same as the bitline to which the data of the reference cell RC is transmitted. Namely, as described above, among sub cell arrays, the main cell MC within the sub cell array above the sensing amplifier S/A is operated together with the reference cell RC within the sub cell array at the bottom portion of the sensing amplifier S/A. Accordingly, the data of the main cell is transmitted to the bitline within the sub cell array at the top portion while the data of the reference cell is transmitted to the bitline within the sub cell array at the bottom portion.

When the data of the main cell MC and the data of the reference cell RC are sufficiently transmitted to their corresponding bitline, the wordline W/L and the reference wordline REF_W/L are changed to a low level at the end of the B period, so that the bitline B/L is separated from the cell.

Therefore, bitline loading due to the difference of the capacitor size between the main cell MC and the reference cell RC can be removed. This improves sensing margin of the sensing amplifier.

During C period, the wordline W/L and the reference wordline REF_W/L are changed to a low level, while during the D period, and the active signal SEN of the sensing amplifier S/A is activated to a high level. Thus, the data of the bitline is amplified.

From the B period to the F period, the plate line P/L is maintained at a high level and begins to change to a low level during the F period. During the B period, the wordline W/L is maintained at a high level and drops to a low level in the C period. The wordline W/L remains at a low level during the C, D and E periods and rises to a high level for the second time in the F period.

The reference plate line REF_P/L is continuously maintained at a high level during and after B period. That is, the reference plate line REF_P/L is only transited to low level during A period.

Finally, when the first pulse of the wordline W/L and the reference wordline REF_W/L are transited from a high level to a low level in periods B and C, the plate line P/L and the reference plate line REF_P/L are not transited Accordingly, interference noise that may occur due to simultaneous transition can be avoided.

If an amplification operation of the sensing amplifier S/A advances to a stable mode, the column selector C/S is activated to high level during E period, and the data of the bitline B/L is exchanged with the data of the data bus. That is, the data of the data bus is forcibly transmitted to the bitline B/L.

The bitline equalizer signal EQ and the reference bitline equalizer signal REF_EQ are changed to a low level in a period, such as period B, where the wordline W/L and the reference wordline REF_W/L are changed to high level.

Also, since the sensing amplifier S/A is continuously activated when the wordline W/L is changed to a second high level during F and G periods of the active period, the bitline B/L continuously maintains the amplified data or reprogrammed data. Accordingly, the data of the main cell MC having a logic value "1" that is destroyed during B period is restored or written during G period.

Also, during F period in which the wordline W/L and the plate line P/L are both changed to a high level, the data of the main cell MC having a logic value "0", destroyed during B period is written.

When the restoring step ends during G period, the chip enable signal CSBpad is changed to high level, so that the precharge period H starts.

The storage node SN of the bitline B/L and the reference cell RC is initiated to the ground level during H period, and remains in standby state to start the next cycle.

The read mode shown in FIG. 9b is equal to the write mode in its waveforms. As described above, however, in the write mode, external data is forcibly input to the bitline through the data input pad (Din pad, not shown). In the read mode, the data of the sensing amplifier S/A is transmitted to external data input/output pad (Din/out pad, not shown). (That is, the data of the sensing amplifier S/A is transmitted to the data bus.) Also, in the read mode, the write enable signal WEBpad is in high level during the active period.

The method for driving the aforementioned nonvolatile ferroelectric memory device according to the second and third embodiments of the present invention will now be described.

Figure 10A:
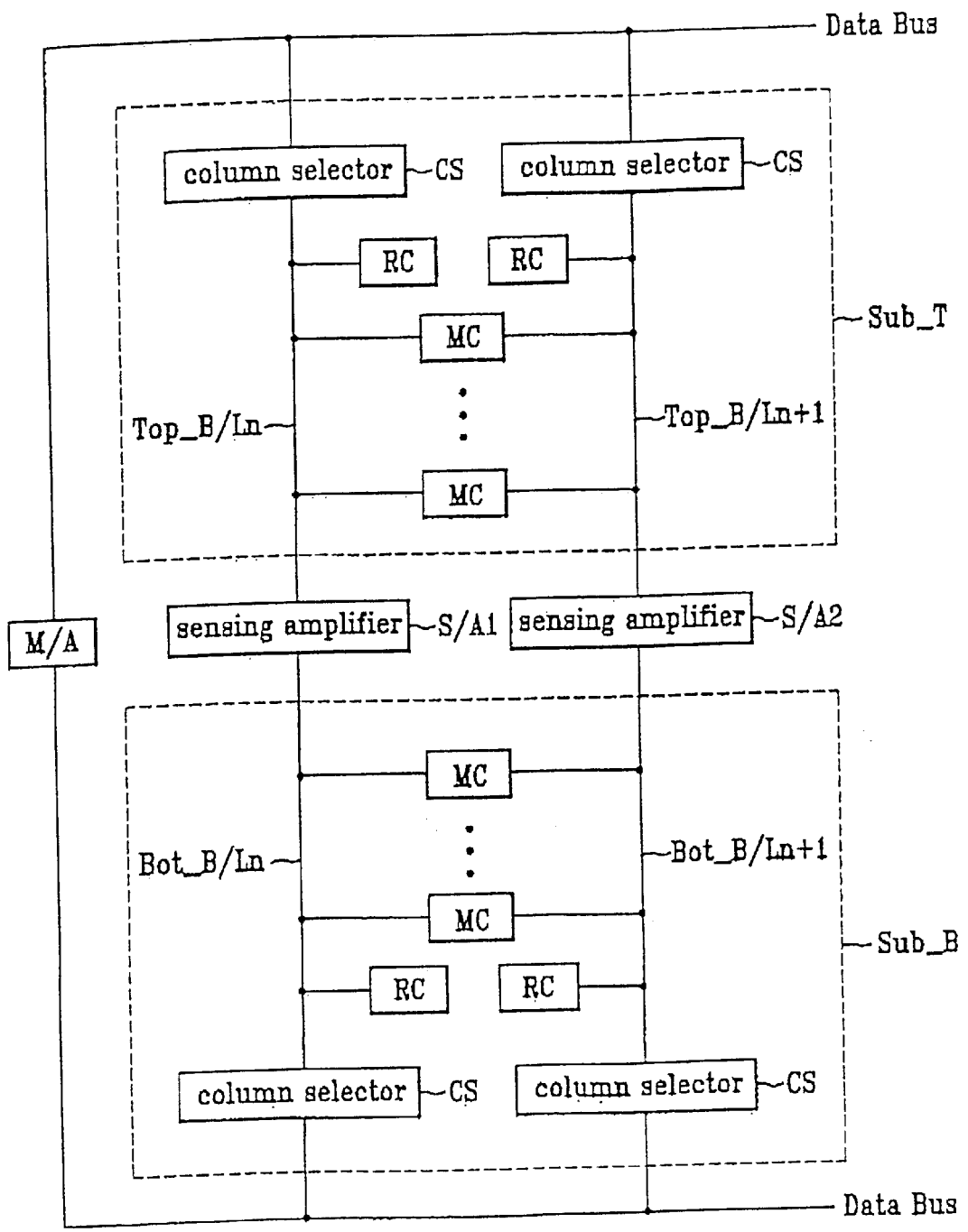
FIG. 10a depicts a schematic view of a nonvolatile ferroelectric memory device according to a second embodiment of the present invention.
Figure 10B:
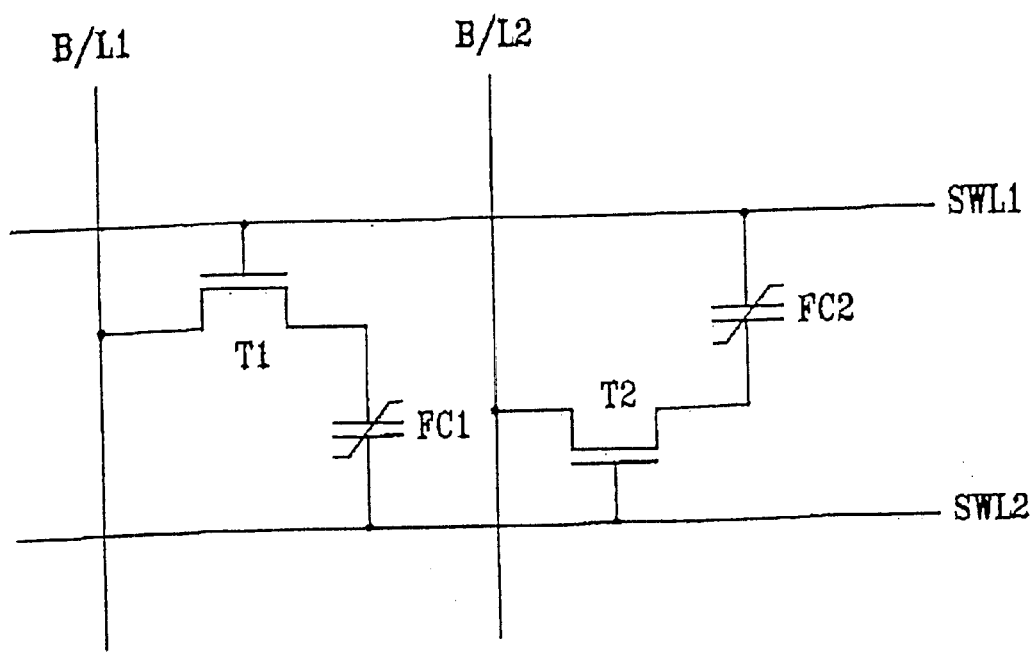

FIG. 10a is a schematic view of the nonvolatile ferroelectric memory device according to the present invention, and FIG. 10b is a schematic view of the main cell MC of FIG. 10a.

As shown in FIG. 10a, the nonvolatile ferroelectric memory device according to the present invention includes a plurality of sub cell arrays sub_T and sub_B.

Each of the sub cell arrays sub_T, sub_B include two bitlines Top_B/Ln, Top_B/Ln+1 and Bot_B/Ln, Bot_B/Ln+1, a plurality of main cells MC arranged in row direction between the two bitlines, a reference cell RC respectively connected to each bitline, and a column selector C/S.

Two sensing amplifiers S/A1, S/A2 are arranged between adjacent top and bottom sub cell arrays sub_T and sub_B. Sensing amplifier S/A1 is connected between bitlines Top_B/Ln and Bot_B/Ln, and sensing amplifier S/A2 is connected between bitlines Top_B/Ln+1 and Bot_B/Ln+1. The top sub cell array sub_T includes bitlines Top_B/Ln and Top_B/Ln+1 while the bottom sub cell array sub_B includes bitlines Bot_B/Ln and Bot_B/Ln+1.

The main cell MC includes a plurality of split wordline pairs having first and second split wordlines SWL1, SWL2 as a pair of split wordlines. The bitlines Top_B/Ln, Top_B/Ln+1, Bot_B/Ln and Bot_B/Ln+1 are formed across the split wordline SWL1, SWL2 pairs.

The reference cell RC is preferably located adjacent to the column selector C/S on each bitline Top_B/Ln, Top_B/Ln+1, Bot_B/Ln and Bot_B/Ln+1 and connected to the corresponding bitline.

Each data bus of the top and bottom sub cell arrays sub_T, sub_B is connected to the main amplifier M/A located at one end of the sub cell arrays sub_T, sub_B.

The reference cell RC within the sub cell array sub_T is accessed when the main cell MC within the sub cell array sub_B is accessed. On the other hand, the reference cell RC within the sub cell array sub_B is accessed when the main cell MC within the sub cell array sub_T is accessed.

The column selector CS selectively activates a corresponding column bitline using a Y(column) address.

If the column selector CS is in high level, the corresponding column bitline is connected to the data bus, so as to enable data transmission.

The main cell MC of the aforementioned nonvolatile ferroelectric memory device, as shown in FIG. 10b, includes a first split wordline SWL1 and a second split wordline SWL2 formed in row direction at constant intervals; a first bitline B/L1 and a second bitline B/L2 formed across the first and second split wordlines SWL1 and SWL2; a first transistor T1 with a gate connected to the first split wordline SWL1 and a drain connected to the first bitline B/L1, a first ferroelectric capacitor FC1 connected between the source of the first transistor T1 and the second split wordline SWL2, a second transistor with a gate connected to the second split wordline SWL2 and a drain connected to the second bitline B/L2, and a second ferroelectric capacitor FC2 connected between the source of the second transistor T2 and the first split wordline SWL1.

A cell array is formed by forming a plurality of the above unit cells. In view of data storage, the unit cell can include a transistor and a ferroelectric capacitor, the transistor including a split wordline and a bitline. In view of data structure, the unit cell has a 2T/2C structure that can include two transistors 2T and two ferroelectric capacitors 2C, and a pair of split wordlines and two bitlines.

The method for driving the aforementioned nonvolatile ferroelectric memory device according to the second embodiment of the present invention will now be described.

Figure 11B:
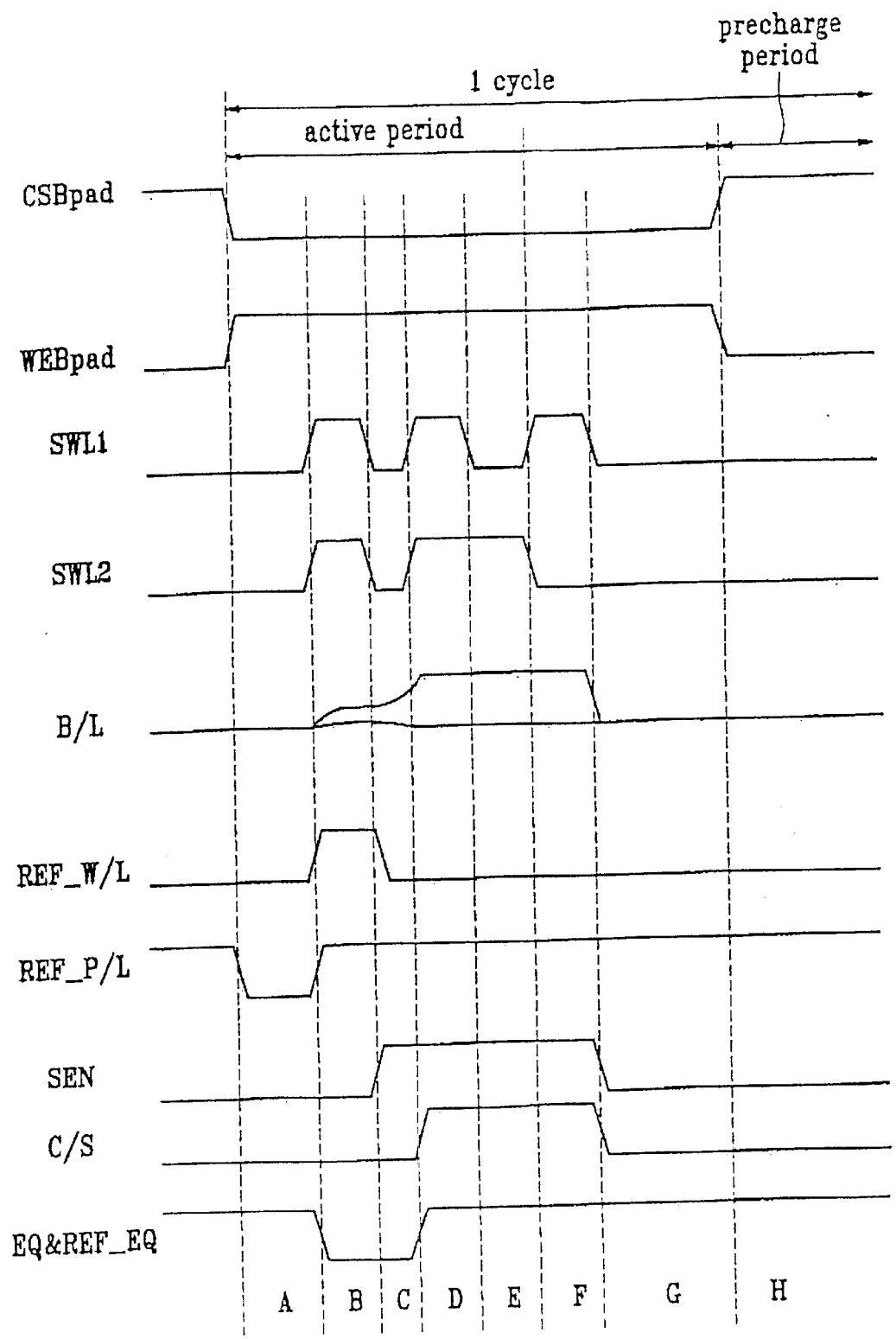

FIG. 11a is a timing chart showing the operation of the write mode according to the second embodiment of the present invention, which is applied to the nonvolatile ferroelectric memory device of FIG. 10a. FIG. 11b is a timing chart showing the operation of a read mode according to the second embodiment of the present invention, which is applied to the nonvolatile ferroelectric memory device of FIG. 10a.

In the second embodiment of the present invention, the first split wordline SWL1 may be activated three times to a high level in the active period. When the first high level signal of the first and second split wordlines SWL1 and SWL2 is changed to a low level, the corresponding sensing amplifier is driven.

When the first and second split wordlines SWL1, SWL2 are activated to the first high level signal, the data reading operation is performed. When the first pulse is changed to low level, i.e., when the first pulse is inactivated, the corresponding sensing amplifier is activated. When the first and second split wordlines SWL1, SWL2 are activated to the second high level signal in the active period, the data is restored or new data is written.

As shown in FIGS. 11a and 11b, if the chip enable signal CSBpad is changed to a low level, the active period starts.

In the write mode, the write enable signal WEBpad is in low level during the active period. While in the read mode, the write enable signal WEPpad is in high level during the active period, as shown in FIG. 11b.

The driving methods in the read and write modes are similar.

Period A denotes the period before the first and second split wordlines SWL1 and SWL2 are activated to high level. In this A period, all of bitlines are preferably precharged at a threshold voltage level and the reference plate line REF_P/L is changed to low level.

Period B denotes the period that the first and second split wordlines SWL1 and SWL2 are changed to a high level. Also, data of the ferroelectric capacitors FC1 and FC2 (see FIG. 10b) in the cell are transmitted to the bitlines B/L1 and B/L2 so that the bitline level is varied.

The ferroelectric capacitor has a logic value "1", because electric fields having opposite polarities are applied to the bitline and the split wordline, the polarity of the ferroelectric is destroyed allowing a large amount of current to flow. Thus, a high voltage is induced in the bitline. By contrast, the ferroelectric capacitor has a logic value "0", when electric fields having the same polarities are applied to the bitline and the split wordline, polarity of the ferroelectric capacitor is not destroyed and a small amount of current flows. Thus, a low voltage is induced in the bitline.

Subsequently, the first and second split wordlines SW1, SWL2 and the reference wordline REF_W/L are changed to low level during C period so as to activate the corresponding sensing amplifier active signal SEN. As a result, the data of the bitline is amplified.

Before the reading operation step FS, the reference plate line REF_P/L is in a low level (during the period A). After period A and in the other periods, the REF_P/L is maintained at a high level.

Thus, when the first split wordline SWL1 and the reference wordline REF_W/L are transited from high level to low level, the reference plate line REF_P/L is not simultaneously changed.

If amplification operation of the sensing amplifier S/A advances to a stable mode, the column selector C/S is activated to high level during D to F periods, so that the data of the bitlines B/L1 and B/L2 is exchanged with the data of the data bus. That is, the data of the data bus is forcibly transmitted to the bitlines B/L1 and B/L2.

Also, since the sensing amplifier S/A is continuously activated during D, E and F periods, the bitlines B/L1 and B/L2 continuously maintain the amplified data or reprogrammed data. During D period, the first and second split wordlines SWL1, SWL2 are transited to high level. Thus, the data having a logic value "0", which was destroyed during B period is restored or written.

During E period in which the first split wordline SWL1 is in low level and the second split wordline SWL2 is in high level, the data having a logic value "1", which is destroyed during B period is written.

During F period in which the first split wordline SWL1 is in high level and the second split wordline SWL2 is transited from high level to low level, the data having a logic value "1" of the ferroelectric capacitor is written.

When the restoring operation or the writing operation ends, the chip enable signal CSBpad is transited to a high level, so that the precharge period (H period) starts.

The storage node of the bitline B/L and the reference cell RC is initiated to the ground level during H period, and is in standby state to start the next cycle.

The second method for driving the nonvolatile ferroelectric memory device, constructed as shown in FIGS. 10a and 10b will now be described.

Figure 12A:
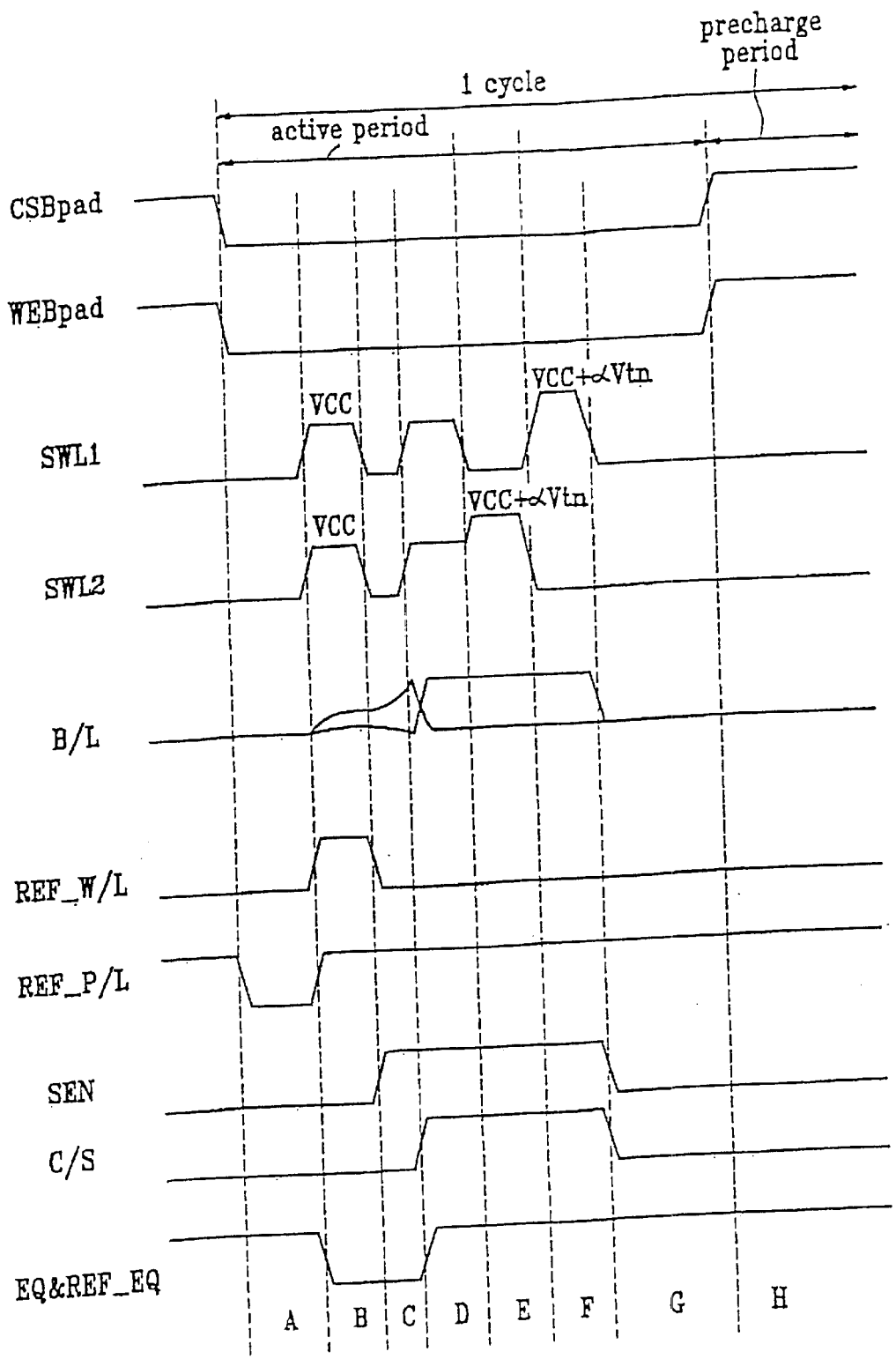
Figure 12B:
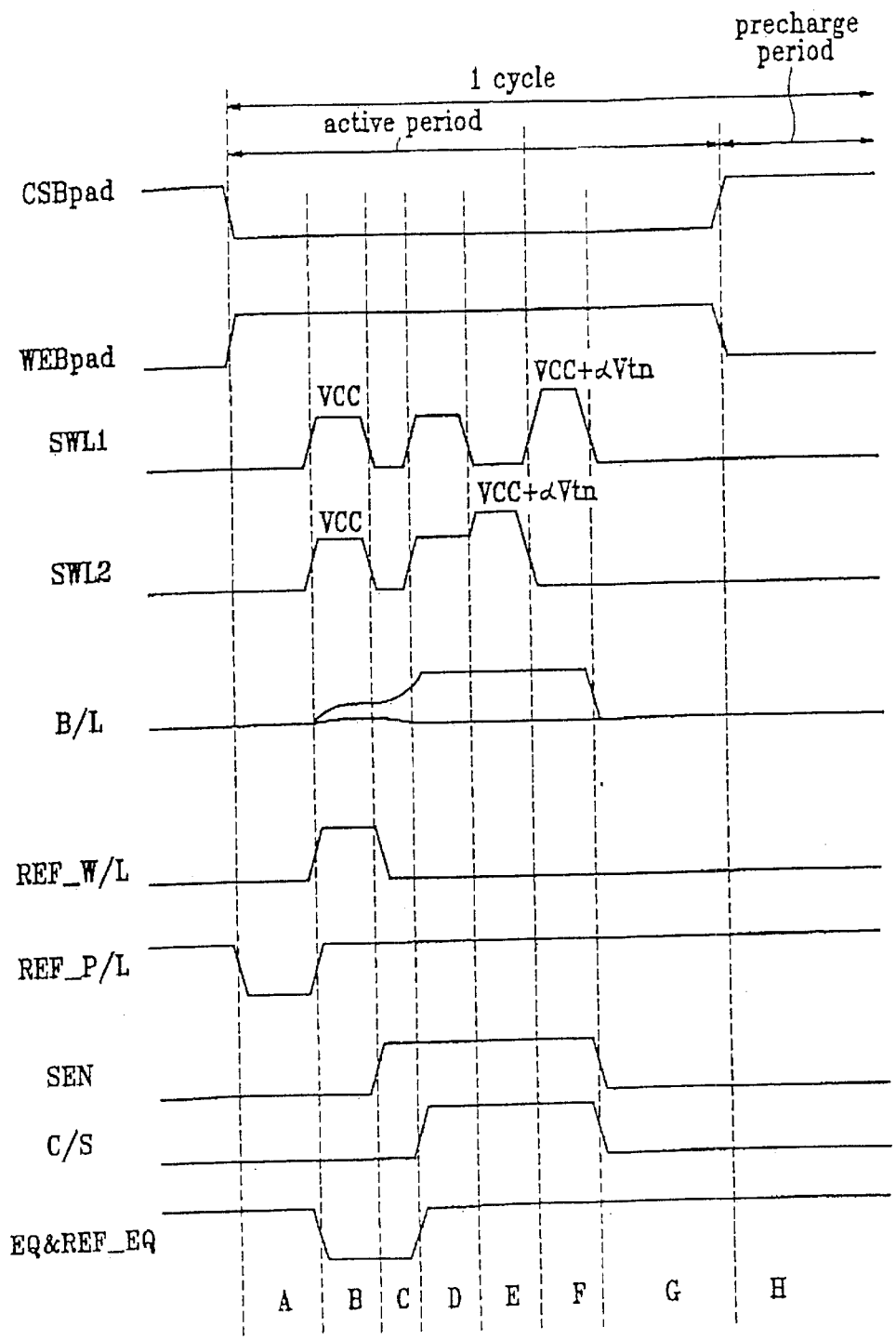

FIG. 12a is a timing chart showing the operation of a write mode according to the second embodiment of the present invention, for driving the nonvolatile ferroelectric memory device of FIG. 10a. FIG. 12b is a timing chart showing the operation of a read mode according to the second method for driving the nonvolatile ferroelectric memory device of FIG. 10a.

The second method for driving the nonvolatile ferroelectric memory device of FIG. 10a is almost equal to the method discussed relative to FIGS. 11a and 11b for driving the nonvolatile ferroelectric memory device of FIG. 10a.

In the second method of the present invention, the first split wordline SWL1 is boosted in F period to generate a higher voltage than a voltage in B or C periods. The second split wordline SWL2 is boosted in period E to generate a higher voltage than a voltage in B or D period.

In other words, the first split wordline SWL1 is boosted by $\alpha$Vtn to generate VCC+$\alpha$Vtn in F period while the second split wordline SWL2 is boosted by $\alpha$Vtn to generate VCC+$\alpha$Vtn, wherein $\alpha$ denotes a constant greater than 1 and Vtn denotes a threshold voltage of the NMOS transistor. This is to transmit high data of the bitlines B/L1 and B/L2 to the ferroelectric capacitors FC1 and FC2 including when low voltage exists and the restoring operation is performed in the transistors T1 and T2 in FIG. 10b.

As described above, during driving operation according to the second method of driving the nonvolatile ferroelectric device of FIG. 10a, the boost voltage output to the first and second split wordlines SWL1, SWL2 is supplied from a boost power generator (shown in FIG. 13) according to the present invention. The boost power generator will be described below.

Figure 13:
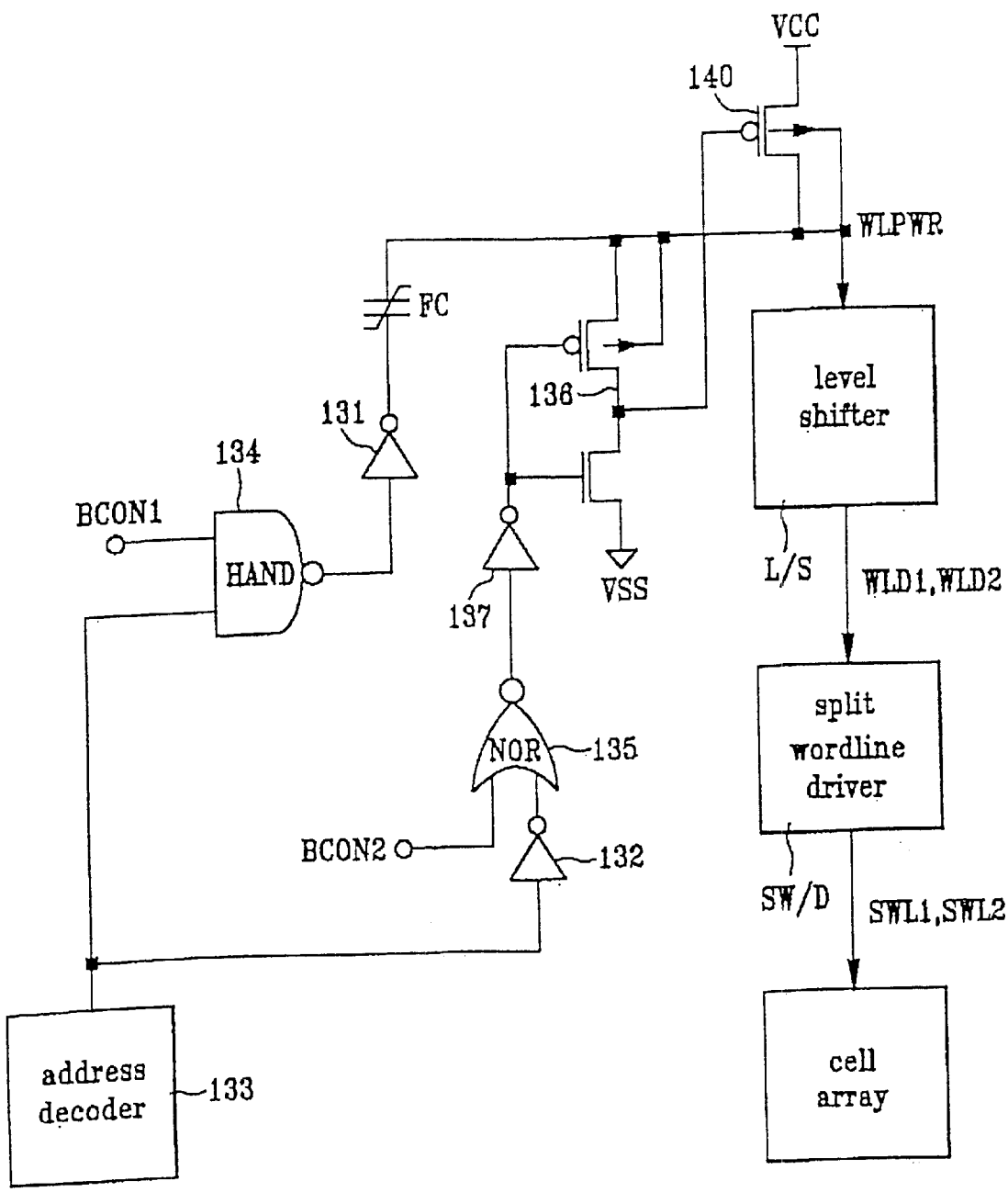
FIG. 13 depicts a schematic view of a boost power generator for generating a boost voltage during driving operation according to the third embodiment of the present invention.

The boost power generator of the present invention, as shown in FIG. 13, includes an address decoder 133, a NAND gate 134 for performing the logic AND operation of the address decoder 133, a first external control signal BCON1, a first inverter 131 for inverting a signal of the NAND gate 134, a ferroelectric capacitor for receiving a signal of the first inverter 131, a second inverter 132 for inverting a signal of the address decoder 133. Additionally, the boost power generator includes a NOR gate 135 for performing logic OR operation of the signal of the second inverter 132 and a second external control signal BCON2 and, a third inverter 137 for inverting a signal of the NOR gate 135. A CMOS transistor 136 is located between the ferroelectric capacitor FC and a ground voltage terminal VSS, for receiving a signal of the third inverter 137. A PMOS transistor 140 is also located between a power source voltage terminal VCC and the ferroelectric capacitor FC, and is for receiving a signal of an output terminal of the CMOS transistor 136. The boost power generator also has a level shifter L/S for performing a level shifting operation by receiving a signal WLPWR dependent on the on/off operation of the PMOS transistor 140. The level shifter L/S is followed by a split wordline driver SWL/D which outputs the level shifted voltage to the first and second split wordlines SWL1, SWL2 based on received signals WLD1 and WLD2 generated by the level shifter L/S.

A cell array block of FIG. 13 corresponds to a plurality of the main cells of FIG. 10a provided with the first and second split wordlines SWL1, SWL2.

The signal WLPWR generates a VCC or a boosted voltage VCC+$\alpha$Vtn boosted from VCC.

In FIG. 13, when the first external control signal BCON1 is output at a high level and the second external control signal BCON2 is output at a low level during F period of the active period, the signal WLPWR generates VCC+$\alpha$Vtn, so that the boosted voltage of VCC+$\alpha$Vtn is generated in the first split wordline SWL1.

Furthermore, when the first external control signal BCON1 is output at a high level and the second external control signal BCON2 is output at a low level during E period of the active period, the signal WLPWR denotes VCC+$\alpha$Vtn, so that the boosted voltage of VCC+$\alpha$Vtn is generated in the second split wordline.

As described above, the nonvolatile ferroelectric memory device and method for driving the same has the following advantages.

First, when the wordlines are activated two or more times during the active period of one cycle, the level width of the first wordline is restricted. Thus, it is possible to restrict the quantity of charges generated in the cell, so that the data can uniformly be written or read in all the cell arrays without depending on the position.

In addition, since the sensing amplifier is activated to high level after the first wordline is inactivated to low level, loading conditions of a resistor and a capacitor in the main bitline and the reference bitline in view of the sensing amplifier can be equal to each other. Thus, the sensing voltage can be minimized. This reduces the size of the cell, thereby reducing the size of the chip.

Finally, when high data is written or restored in the ferroelectric capacitor, the first and second split wordlines are respectively boosted to VCC+$\alpha$Vtn, so that the nonvolatile ferroelectric memory device can be operated at low voltage.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A nonvolatile ferroelectric memory device, comprising:
    a first sub cell array and a second sub cell array each including:
        a plurality of main cells, each main cell of the plurality of main cells having a split wordline pair including a first split wordline and a second split wordline,
        a main bitline pair including a first bitline and a second bitline, the first bitline and second bitline formed across the split wordline and the second split wordline,
        a reference cell coupled to the first bitline and second bitline, and
        a first column selector between the first bitline and a data bus and a second column selector between the second bitline and the databus, the first and second column selectors for selectively selecting the first or second bitlines; and
    a first sensing amplifier and a second sensing amplifier connected between the first sub cell array and the second sub cell array.

2. The nonvolatile ferroelectric memory device of claim 1, wherein
    the main cell includes a first transistor coupled between the first split word line and the first bitline,
    a first ferroelectric capacitor coupled between the first transistor and the second split wordline,
    a second transistor coupled between the second split word line and the second bitline; and
    a second ferroelectric capacitor coupled between the second transistor and the first split wordline.

3. The nonvolatile ferroelectric memory device of claim 1, wherein each of the reference cells include:
    a reference cell bitline;
    a reference wordline formed across the reference cell bitline;
    a plurality of the ferroelectric capacitors connected to a switching block in parallel;
    the switching block for selectively transmitting a reference voltage stored in a ferroelectric capacitor to the reference cell bitline and being controlled by a signal of the reference wordline; and
    a level initiating block for selectively initiating a level of an input terminal of the switching block connected to the ferroelectric capacitor.

4. The nonvolatile ferroelectric memory device of claim 3, wherein the switching block includes a first NMOS transistor with a gate connected to the reference wordline, a drain connected to the bitline, and a source connected to a storage node.

5. The nonvolatile ferroelectric memory device of claim 3, wherein
    the level initiating block is controlled by a reference cell equalizer control signal which is a control signal for initiating a storage node of the reference cell, and includes a second NMOS transistor connected between a source of the first NMOS transistor and a ground terminal.

6. The nonvolatile ferroelectric memory device of claim 3, wherein
    the plurality of the ferroelectric capacitors are arranged in parallel using a first NMOS transistor as a first electrode and a reference plate line as a second electrode.

7. The nonvolatile ferroelectric memory device of claim 1, wherein
    the first and second column selectors include two NMOS transistors which perform a switching operation by receiving first and second output signals YSEL<n> and YSEL<n+1> of a column decoder to transmit data of the data bus to one of the respective first or second bitlines, and
    the NMOS transistors controlled by the first output signal YSEL<n> are arranged in a first (or odd numbered) bitline unit while the NMOS transistors controlled by the second output signal Y<n+1> are arranged in a second (or even numbered) bitline unit, so that the NMOS transistors are alternately arranged one by one per each bitline.

8. The nonvolatile ferroelectric memory device of claim 2, further comprising a boost power generator for generating a higher voltage in the first and second split wordlines to allow the plurality of main cells to transmit high data of the first and second bitlines to the first and second ferroelectric capacitors even in a case of low voltage when a writing or restoring operation is performed.

9. The nonvolatile ferroelectric memory device of claim 8, wherein the boost power generator includes:
    an address decoder for generating an address signal;
    a NAND gate for performing logic AND operation of the address signal and a first external control signal BCON1;
    a first inverter for inverting a signal of the NAND gate;
    a third ferroelectric capacitor for receiving a signal of the first inverter;
    a second inverter for inverting a signal of the address decoder;
    a NOR gate for performing logic OR operation of a signal of the second inverter and a second external control signal BCON2;
    a third inverter for inverting a signal of the NOR gate;
    a CMOS transistor formed between the ferroelectric capacitor and a ground voltage terminal VSS, for receiving a signal of the third inverter;
    a PMOS transistor formed between a power source voltage terminal VCC and the third ferroelectric capacitor and for receiving a signal of an output terminal of the CMOS transistor;
    a level shifter for performing level shifting operation by receiving a signal of a node connected to the drain of the PMOS transistor and the third ferroelectric capacitor; and
    a split wordline driver for outputting the level shifted signal to the first and second split wordlines by receiving wordline driving signals generated by the level shifter.

10. A method for driving a nonvolatile ferroelectric memory device that includes a main cell and a reference cell provided with one transistor and one or more ferroelectric capacitors among a first voltage applying line, which is a first wordline, a bitline and a second voltage applying line, the method comprising:

first activating the first wordline and a reference wordline to a relatively high level in an active period of one cycle;

inactivating the first wordline and the reference wordline;

activating a sensing amplifier after the first wordline is inactivated;

second or third activating the first wordline at a relatively high level in a state that the sensing amplifier is activated in the active period;

activating the second voltage applying line to a relatively high level at least once during the active period and such that the activation of the second voltage applying line is coincident with the second or third activation of the first wordline at one point; and transiting a chip enable signal from a relatively low level to a relatively high level to precharge the chip enable signal.

11. The method of claim 10, further comprising:

activating a column selector in a state that the sensing amplifier is activated.

12. The method of claim 10, further comprising:

inactivating bitline equalizer signals EQ and REF_FQ during a period before the first wordline is first activated and second activated in the active period.

13. The method of claim 10, wherein the active period starts when the chip enable signal is changed to a relatively low level.

14. The method of claim 10, wherein the second voltage applying line is a reference plate line and connected to the reference cell, and the reference plate line is inactivated only in the active period before the first wordline is primarily activated.

15. The method of claim 10, further comprising:

maintaining a write enable signal at a relatively low level during the active period in a write mode of the non-volatile ferroelectric memory device.

16. The method of claim 10, further comprising:

maintaining a write enable signal at a relatively high level during the active period in a read mode of the non-volatile ferroelectric memory device.

17. The method of claim 10, wherein the first voltage applying line is connected to the reference cell and is the reference wordline, which is activated only when the first wordline is primarily activated.

18. A method for driving a nonvolatile ferroelectric memory device that includes a plurality of sub cell arrays provided with a plurality of main cells and a reference cell, the reference cell of any sub cell array of the plurality of sub sell arrays being operated together with the main cell of a neighboring sub cell array and each sub cell array including a transistor and at least one ferroelectric capacitor among a bitline, a first wordline, a reference wordline, and a plate line, the method comprising:

first activating the first wordline, the reference wordline, the plate line, and a reference plate line to a relatively high level in an active period of one cycle;

inactivating the first wordline and the reference wordline;

activating a sensing amplifier after the first wordline is inactivated;

second activating the first wordline to a relatively high level in a state that the sensing amplifier is activated during the active period;

inactivating the plate line in a state that the first wordline is second activated; and transiting a chip enable signal from a relatively low level to a relatively high level to precharge the chip enable signal.

19. The method of claim 18, further comprising:

activating a column selector before the first wordline is second activated in a state that the sensing amplifier is activated.

20. The method of claim 18, further comprising:

inactivating bitline equalizer signals EQ and REF_FQ during a period before the wordline is first activated and second activated in the active period.

21. The method of claim 18, wherein the active period starts when the chip enable signal is changed to a relatively low level.

22. The method of claim 18, further comprising:

maintaining a write enable signal at a relatively low level during the active period in a write mode of the non-volatile ferroelectric memory device.

23. The method of claim 18, further comprising:

maintaining a write enable signal at high level during the active period in a read mode of the nonvolatile ferro-electric memory device.

24. The method of claim 18, wherein the reference wordline is activated only when the first wordline is primarily activated.

25. The method of claim 18, wherein the reference plate line is inactivated only in the active period before the first wordline is primarily activated.

26. A method for driving a nonvolatile ferroelectric memory device that includes a plurality of main cell arrays arranged in row direction including wordlines of split structures having first and second split wordlines in pairs, a plurality of bitlines arranged across the first and second split wordlines, a reference cell including a transistor and at least one ferroelectric capacitor among a reference wordline, a reference plate line and the bitline, and a column selector arranged between a data line and the bitlines, the method comprising:

first activating the first and second split wordlines, the reference wordline, and the reference plate line to a relatively high level in an active period of one cycle;

inactivating the first and second split wordlines and the reference wordline;

activating a sensing amplifier after the first split wordline is inactivated;

second activating the second split wordline at a relatively high level during the active period;

second and third activating the first split wordline in an order of a relatively high, a relatively low, and a relatively high level in a state that the sensing amplifier is activated and the second split wordline is second activated during the active period; and transiting a chip enable signal from a relatively low level to a relatively high level to precharge the chip enable signal.

27. The method of claim 26, further comprising:

activating a column selector in a state that the sensing amplifier is activated.

28. The method of claim 26, further comprising:

inactivating all of bitline equalizer signals EQ and REF_FQ during a period before the first and second split wordlines are first activated and second activated in the active period.

29. The method of claim 26, further comprising:
maintaining a write enable signal at a relatively low level during the active period in a write mode of the nonvolatile ferroelectric memory device.

30. The method of claim 26, further comprising:
maintaining a write enable signal at a relatively high level during the active period in a read mode of the nonvolatile ferroelectric memory device.

31. The method of claim 26, wherein
the reference wordline is activated only when the first and second split wordlines are first activated.

32. The method of claim 26, wherein
the reference plate line is inactivated only in the active period before the first and second split wordlines are first activated.

33. A method for driving a nonvolatile ferroelectric memory device that includes a plurality of main cell arrays arranged in row direction including wordlines of split structures having first and second split wordlines in pairs, a plurality of bitlines arranged across the first and second split wordlines, a reference cell including a transistor and at least one ferroelectric capacitor among a reference wordline, a reference plate line and a bitline, and a column selector arranged between a data line and the bitlines, the method comprising:

first activating the first and second split wordlines, the reference wordline, and the reference plate line at a relatively high level in an active period of one cycle;

inactivating the first and second split wordlines and the reference wordline;

activating a sensing amplifier after the first split wordline is inactivated;

second activating the second split wordline during the active period in a step form of relatively high and boosted high level;

second and third activating the first split wordline in the order of relatively high, relatively low, and boosted high level in a state that the sensing amplifier is activated and the second split wordline is second activated during the active period; and transiting a chip enable signal from a relatively low level to a relatively high level to precharge the chip enable signal.

34. The method of claim 33, wherein
the boosted high level is VCC+$\alpha$Vtn when the high level has a value of VCC, where VCC is a power voltage, $\alpha$>1, and Vtn is a threshold voltage of NMOS transistor.

35. The method of claim 33, wherein
a column selector is activated in a state that the sensing amplifier is activated.

36. The method of claim 33, further comprising:
inactivating all of bitline equalizer signals EQ and REF_FQ during a period before the first and second split wordlines are first activated and second activated in the active period.

37. The method of claim 33, further comprising:
maintaining a write enable signal at a relatively low level during the active period in a write mode of the nonvolatile ferroelectric memory device.

38. The method of claim 33, further comprising:
maintaining the write enable signal at a relatively high level during the active period in a read mode of the nonvolatile ferroelectric memory device.

39. The method of claim 33, wherein
the reference wordline is activated only when the first and second split wordlines are primarily activated.

40. The method of claim 33, wherein
the reference plate line is inactivated only in the active period before the first and second split wordlines are primarily activated.

* * * * *